(12) United States Patent
Hayakawa

(10) Patent No.: US 7,983,318 B2
(45) Date of Patent: Jul. 19, 2011

(54) OPTICAL SEMICONDUCTOR DEVICE

(75) Inventor: Akinori Hayakawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/554,568

(22) Filed: Sep. 4, 2009

(65) Prior Publication Data

US 2010/0020840 A1     Jan. 28, 2010

Related U.S. Application Data

(63) Continuation of application No. PCT/JP2007/054207, filed on Mar. 5, 2007.

(51) Int. Cl.
*H01S 5/00* (2006.01)
(52) U.S. Cl. ........... 372/50.11; 372/50.1; 372/50.21; 372/20; 372/23
(58) Field of Classification Search ........... 372/50.11, 372/50.1, 50.21, 20, 23
See application file for complete search history.

(56) References Cited

U.S. PATENT DOCUMENTS

| | | | |
|---|---|---|---|
| 7,174,070 B2 * | 2/2007 | Kim et al. | 385/37 |
| 2002/0071458 A1 | 6/2002 | Iwafuji | |
| 2003/0007719 A1 * | 1/2003 | Forrest et al. | 385/14 |

FOREIGN PATENT DOCUMENTS

| | | |
|---|---|---|
| JP | 63-160391 A | 7/1988 |
| JP | 4-186690 A | 7/1992 |
| JP | 2002-185074 A | 6/2002 |
| JP | 2006-080412 A | 3/2006 |
| JP | 2006-216695 A | 8/2006 |

OTHER PUBLICATIONS

International Search Report of PCT/JP2007/054207, Mailing Date of Apr. 3, 2007.

* cited by examiner

*Primary Examiner* — Kinam Park
(74) *Attorney, Agent, or Firm* — Fujitsu Patent Center

(57) ABSTRACT

An optical semiconductor device includes a semiconductor laser, a first optical waveguide, an optical coupler for branching light guided from the semiconductor laser through the first optical waveguide into two lights, two second optical waveguides, diffraction gratings provided individually on the two second optical waveguides, and an optical detector for detecting light guided through one of the two diffraction gratings, and the components are provided on the same substrate. The optical semiconductor device is configured such that reflection returning lights from the diffraction gratings side to the semiconductor laser side interfere with each other and thereby extinguish each other at the optical coupler and the phases of the reflection returning lights from the diffraction gratings side are displaced from each other by $\pi$ at the optical coupler portion.

15 Claims, 10 Drawing Sheets

US 7,983,318 B2

OPTICAL SEMICONDUCTOR DEVICE

CROSS-REFERENCE TO RELATED APPLICATION(S)

This application is a continuation Application of a PCT international application No. PCT/JP2007/054207 filed on Mar. 5, 2007 in Japan, the entire contents of which are incorporated by reference.

FIELD

The embodiments discussed herein are related to an optical semiconductor device including an optical detector and a semiconductor laser.

BACKGROUND

Together with drastic increase of the demand for communication in recent years, development of a wavelength division multiplexing communication system (WDM communication system) for multiplexing a plurality of signal lights having wavelengths different from each other to implement high-capacity transmission with one optical fiber is advancing.

In such a wavelength division multiplexing communication system as just described, it is demanded for a semiconductor laser to oscillate with a wavelength suitable for a predetermined channel. Therefore, it is essentially required to monitor and control the oscillation wavelength of a semiconductor laser which is a light source.

For example, there is a technique wherein a module section having a tunable light source device including a semiconductor laser is configured so as to have an etalon filter having a particular period transmission spectrum and an optical detector and the oscillation wavelength of the tunable light source device is monitored and controlled (hereinafter referred to as first technique).

Further, for example, there is a technique wherein a semiconductor laser device and an optical detector section (including a photodiode and an etalon filter) are provided as a semiconductor laser module in which a beam splitter need not be provided (hereinafter referred to as second technique).

Further, for example, there is a technique wherein the oscillation wavelength is controlled in a DBR type semiconductor laser in which a distribution reflector and an optical detector are integrated (hereinafter referred to as third technique).

Further, for example, there is a technique wherein the oscillation wavelength of a laser is monitored in a three-electrode DFB semiconductor laser in which a tunable semiconductor laser, a distribution reflector including a grating, an optical isolator and an optical receiver are integrated (hereinafter referred to as fourth technique).

SUMMARY

According to an aspect of the embodiment, an optical semiconductor device includes a semiconductor laser, a first optical waveguide connected to the semiconductor laser, an optical coupler adapted to branch light guided from the semiconductor laser through the first optical waveguide into two lights, two second optical waveguides connected to the optical coupler, a diffraction grating provided in each of the two second optical waveguides, and an optical detector adapted to detect light guided through one of the two diffraction gratings, and wherein the semiconductor laser, first optical waveguide, optical coupler, second optical waveguides, diffraction gratings and optical detector are integrated on the same substrate, and the optical semiconductor device is adapted such that phases of reflection returning light from the diffraction gratings side are displaced by $\pi$ from each other at a location of the optical coupler so that the reflection returning lights from the diffraction gratings side to the semiconductor laser side interfere with each other and thereby extinguish each other at the optical coupler.

The object and advantages of the embodiment will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
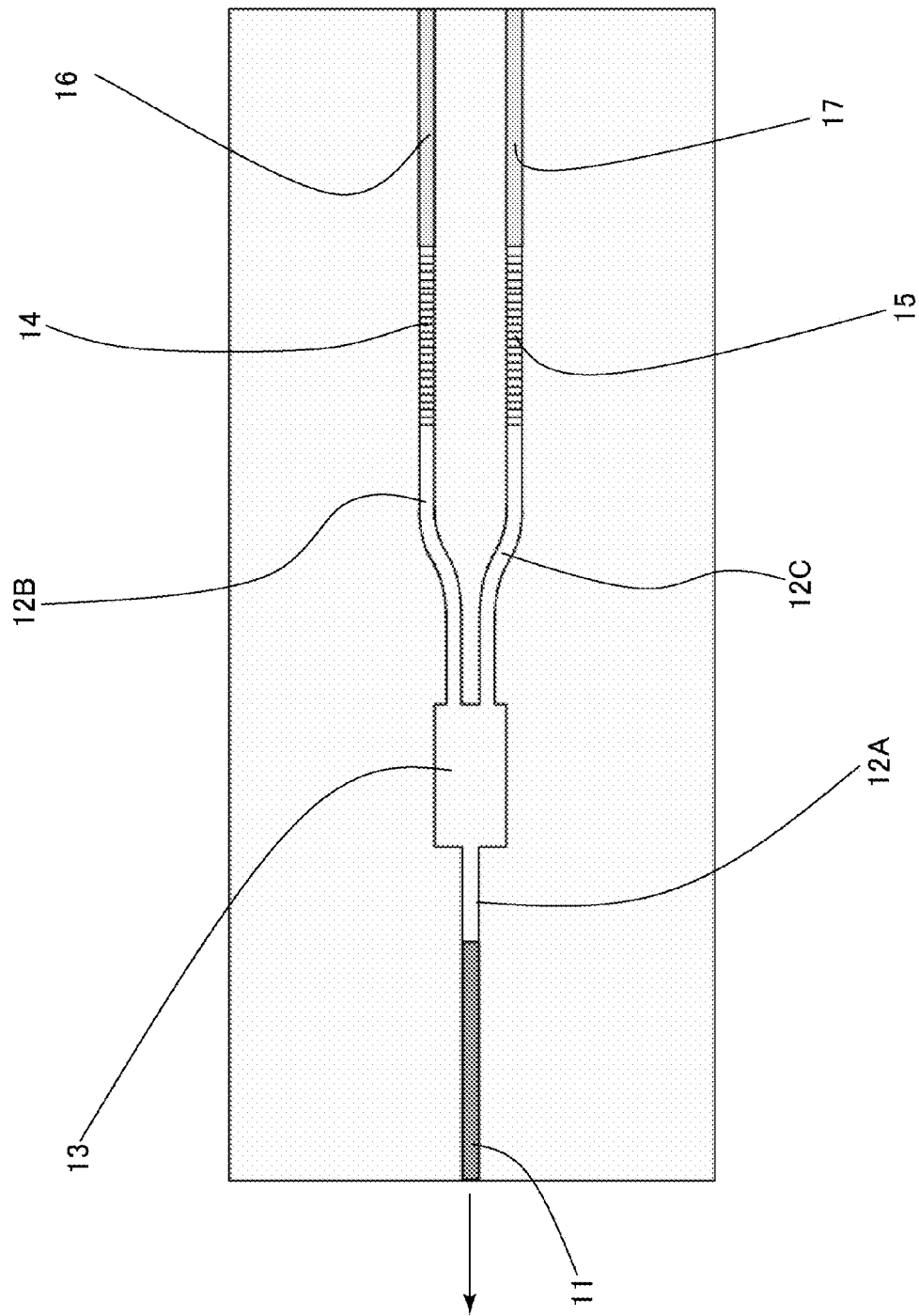
FIG. 1 is a schematic top plan view illustrating a configuration of an optical semiconductor device according to a first embodiment.

Incidentally, since such a semiconductor laser module having an etalon and a photo detector as disclosed in first technique or second technique mentioned hereinabove is produced basically by combining bulk optical devices (an etalon, a photo detector, an isolator, a beam splitter, various lenses and so forth), precise optical adjustment must be carried out. Therefore, there remains a subject in production man-hour and the cost. Also the module size increases. Further, since the temperatures of the etalon and the laser chip are adjusted at the same time or individually by an electric cooling device (TEC: Thermo-electric cooler), the total area of the module increases and also the power consumption increases.

On the other hand, as disclosed in third technique or fourth technique described above, the technique is disclosed wherein a semiconductor laser and a distribution reflector (wavelength filter) are integrated monolithically without using an etalon such that the oscillation wavelength of the semiconductor laser is monitored and controlled.

Particularly, in third technique described above, the DBR type semiconductor laser includes two distribution reflectors and two optical detectors and detects light passed through the distribution reflectors by means of the optical detectors to monitor the oscillation wavelength of the semiconductor laser.

However, it is worried that reflection returning light from the distribution reflector side has a serious influence on the semiconductor laser in such a structure as just described.

It is to be noted that, in third technique described above, a method may be applied that the reflectance by a grating of a tunable distributed reflector which configures a semiconductor laser oscillation section is increased in order to reduce the influence of the reflection returning light. However, according to the method just described, the degree of freedom in the design for the laser itself decreases. Another method may be applied that the reflectance by the distribution reflector (that is, a diffraction grating to be used as a wavelength filter) which configures an oscillation wavelength measurement section is decreased. However, in the method just described, while reflection returning light can be suppressed, the transmission spectrum is weakened. Therefore, it is predicted that the degree of accuracy of a wavelength monitor which is important decreases.

Further, in fourth technique described above, optical isolators are integrated and an optical isolator is formed on a GaAs substrate using a CdTe/CdMnTe multiple quantum well.

However, normally it is very difficult from a relationship of a lattice constant to grow a layer formed from a group II-VI semiconductor material such as CdTe on a substrate formed from a group III-V semiconductor material such as GaAs and InGaAsP, and the semiconductor device cannot be easily produced with a very popular semiconductor growth method.

It is desirable to provide an optical semiconductor device wherein the influence of reflection returning light to a semiconductor laser is reduced while a wavelength monitoring integrated optical semiconductor device in which device for monitoring an oscillation wavelength of the semiconductor laser is monolithically integrated can be easily produced at a low cost.

In the following, optical semiconductor devices according to embodiments are described with reference to the drawings.

The optical semiconductor devices include an optical detector for monitoring an oscillation wavelength, for example, of a semiconductor laser which is an optical communication light source.

First Embodiment

First, an optical semiconductor device according to a first embodiment is described with reference to FIGS. 1 to 3.

For example, as illustrated in FIG. 1, the optical semiconductor device according to the present embodiment includes a semiconductor laser (here, DFB laser) 11, an optical waveguide (first optical waveguide) 12A connected to the semiconductor laser 11, an optical coupler [photo coupler; for example, an MMI (Multi-Mode Interference) coupler] 13 connected to the optical waveguide 12A, two optical waveguides (second optical waveguides) 12B and 12C connected to the optical coupler 13, diffraction gratings (wavelength filters) 14 and 15 provided on the two optical waveguides 12B and 12C, respectively, an optical detector (photo detector) 16 provided in the proximity of the diffraction grating 14, and a dummy optical detector (dummy photo detector) 17 provided in the proximity of the diffraction grating 15. The optical semiconductor device is configured as a wavelength monitoring mechanism integrated semiconductor laser device (semiconductor integrated device) in which the components described above are monolithically integrated on the same substrate (semiconductor substrate). It is to be noted that a wavelength monitoring section (wavelength monitoring mechanism) is configured from the first optical waveguide 12A, optical coupler 13, second optical waveguide 12B, diffraction grating 14, and optical detector 16.

Then, the semiconductor laser 11 and the two diffraction gratings 14 and 15 are connected by the optical waveguides 12A to 12C and the optical coupler 13 as illustrated in FIG. 1. Consequently, light (signal laser light; signal light; oscillation light) outputted from the semiconductor laser 11 (here, outputted from the rear end face of the semiconductor laser 11) and guided through the first optical waveguide 12A is branched into two lights by the optical coupler 13 (that is, the light is branched at an equal ratio of 1:1). Then, the branched lights are inputted to the two second optical waveguides 12B and 12C so as to be guided to the two diffraction gratings 14 and 15 through the optical waveguides 12B and 12C, respectively. Further, by the diffraction grating 14, part of the light is transmitted and the different part of the light is reflected depending upon the wavelength.

Here, the optical detector 16 is provided at a position at which the intensity of transmission light passed through the diffraction grating 14 can be detected, and the intensity of the light guided through the diffraction grating 14 (here, transmission light passed through the diffraction grating 14) is detected by the optical detector 16.

Here, since the transmittance rate of the diffraction grating 14 depends upon the wavelength, the transmission light passed through the diffraction grating 14 is detected by the optical detector 16 so that light output information including wavelength information (oscillation wavelength information of the semiconductor laser 11) can be obtained. The oscillation wavelength of the semiconductor laser 11 can be monitored based on the light output information including the wavelength information. For example, control of the oscillation wavelength of the semiconductor laser (including control for fixing the oscillation wavelength) can be carried out based on the monitored oscillation wavelength.

It is to be noted that the position at which the optical detector 16 is to be provided is not limited to this, and the optical detector 16 may be provided at a position at which the intensity of reflection light reflected by the diffraction grating 14 can be detected so that the intensity of the light guided through the diffraction grating 14 (that is, reflection light reflected by the diffraction grating 14) is detected by the optical detector 16. For example, two ports may be provided separately on the semiconductor laser 11 side of the optical coupler 13 while optical waveguides are connected to the ports and then optical detectors are provided on the optical waveguides. In this case, the optical detectors detect the intensity of the reflection returning light from the diffraction grating 14 side (including the reflection light reflected by the diffraction grating 14).

Further, the dummy optical detector 17 has a structure same as that of the optical detector 16 and is provided in a region to which light guided through the diffraction grating 15 (here, transmission light passed through the diffraction grating 15) is inputted as illustrated in FIG. 1.

Particularly, in the present embodiment, as illustrated in FIG. 1, reflection lights reflected by the diffraction gratings 14 and 15 become reflection returning lights to be guided through the second optical waveguides 12B and 12C connected to the diffraction gratings 14 and 15 and return to the semiconductor laser 11 side through the optical coupler 13 and the first optical waveguide 12A (the reflection returning lights sometimes include reflection returning light reflected by the optical detector 16, the dummy optical detector 17 or the like). Therefore, the optical semiconductor device in the present embodiment is configured such that the phases of the reflection returning light from the diffraction gratings 14 and 15 side are displaced from each other by π at the optical coupler portion so that the reflection returning lights from the diffraction gratings 14 and 15 side to the semiconductor laser 11 side interfere with each other to cancel (extinguish) each other in the optical coupler 13.

In particular, the optical path lengths of the reflection returning light from the diffraction gratings 14 and 15 are set so as to be different from each other such that the phase difference between the reflection returning lights is equal to π. Here, the lengths (waveguide lengths) of the second optical waveguides 12B and 12C connected to the diffraction gratings 14 and 15 are set so as to be different from each other.

In particular, where the equivalent refractive index of each of the second optical waveguides 12B and 12C, the difference between the waveguide lengths and the wavelength of the signal light are represented by n, ΔL and λ, respectively, the waveguide lengths of the second optical waveguides 12B and 12C are set such that the expression (1) given below is satisfied. Consequently, the phase difference between the reflection returning lights from the diffraction gratings 14 and 15 side at the optical coupler portion can be set equal to π. As a result, the phase difference becomes equal to π when the reflection returning lights are multiplexed (coupled) by the optical coupler 13, and the reflection returning lights are extinguished by interference.

$$n\Delta L = \frac{\lambda}{2}\left(m + \frac{1}{2}\right) \quad (1)$$

(*m*: integer number)

In this instance, even if the phase difference between the reflection returning lights becomes equal to π, if there is a difference between electric field amplitudes of reflection waves, then the reflection returning lights cannot sufficiently cancel each other.

Therefore, in order to sufficiently extinguish the reflection returning light at the optical coupler portion (multiplexing point), the second optical waveguide 12C, diffraction grating 15 and dummy optical detector 17 are provided so as to be optically symmetrical with the second optical waveguide 12B, diffraction grating 14 and optical detector 16 which configure the wavelength monitor section except the waveguide lengths of the second optical waveguides 12B and 12C as illustrated in FIG. 1. It is to be noted that the second optical waveguide 12C, diffraction grating 15 and dummy optical detector 17 individually have a dummy structure which is not used for wavelength monitoring.

In particular, layer structures, materials and compositions, widths and thicknesses of the second optical waveguides 12B and 12C are same as each other. Further, optical characteristics such as a period, a transmittance rate, a reflectance and so forth of the two diffraction gratings 14 and 15 are same as each other. Further, the dummy optical detector 17 and the optical detector 16 have the same layer structure, material and composition.

As described above, in the present optical semiconductor device, the diffraction grating 14 is used as a wavelength filter and wavelength information of signal light is converted into light output information by the optical detector 16, and wavelength monitoring is carried out by detecting the light output information. Further, in order to suppress returning of reflection light secondarily generated by the wavelength monitoring as reflection returning light to the semiconductor laser 11 side, the dummy diffraction grating 15 and the second optical waveguide 12C are disposed so as to be optically symmetrical with the diffraction grating 14 and the second optical waveguide 12B for the wavelength monitoring except the waveguide length of the second optical waveguide 12B connected to the diffraction grating 14, and the difference is set between the waveguide lengths of the second optical waveguides 12B and 12C so that the phase difference between the reflection returning lights from the diffraction gratings 14 and 15 side become equal to π. Consequently, the present optical semiconductor device is configured such that the reflection returning lights from the diffraction gratings 14 and 15 side cancel each other by interference when they are multiplexed at the optical coupler portion.

Next, a fabrication method (production procedure) for the optical semiconductor device according to the present embodiment is described with reference to FIGS. 2A to 2F.

It is to be noted that description is given below taking a device including a DFB laser as the semiconductor laser 11 as an example. Further, while the MOCVD method is used for the growth of semiconductor layers, the growing method is not limited to this. Further, a method to be used for popular fabrication of a semiconductor device, that is, vacuum deposition, sputtering, EB deposition or the like is used for deposition of an SiO$_2$ film or a metal.

Here, as illustrated in FIGS. 2A to 2F, a layer structure for configuring a DFB laser region (semiconductor laser region) 101 and a photo detector region (optical detector region) 105 is produced first, and then a layer structure for configuring a first optical waveguide region 102A, an optical coupler region 103, a second optical waveguide region 102B and a diffraction grating region 104 is produced by etching and re-growth.

Figure 2A:
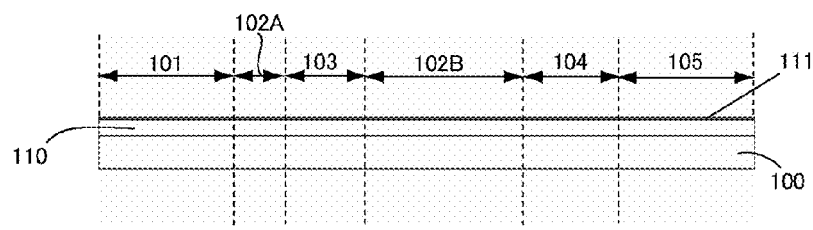
FIGS. 2A to 2F are schematic sectional views illustrating a fabrication method for the optical semiconductor device according to the first embodiment.

First, as illustrated in FIG. 2A, an n-InP buffer layer 110 (thickness: 1 μm) and an n-InGaAsP layer 111 ($\lambda_{PL}$=1.2 μm, thickness: 0.05 μm) are grown in the overall region of an n-InP substrate (semiconductor substrate) 100.

Figure 2B:
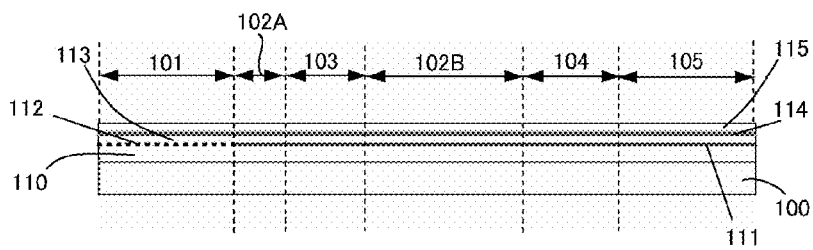

Then, as illustrated in FIG. 2B, a diffraction grating 112 (period of approximately 240 nm) is formed, for example, by EB exposure and dry etching or the like on the n-InGaAsP layer 111 of the DFB laser region 101. It is to be noted that, since the n-InGaAsP layer 111 has the diffraction grating 112 in the DFB laser region 101 thereof, the n-InGaAsP layer 111 is hereinafter referred to sometimes as diffraction grating layer.

Then, as illustrated in FIG. 2B, an n-InP spacer layer 113 (thickness: 0.15 μm) is grown in the overall region on the n-InGaAsP layer 111 such that the diffraction grating 112 is buried, and an SCH layer (thickness: 10 nm; not illustrated) formed from InGaAsP, an InGaAsP distortion MQW layer (active layer) 114 ($\lambda_{PL}$=1.58 μm; here, configured by stacking eight layers each including a well layer having a thickness of 5 nm and a barrier layer having another thickness of 10 nm), an SCH layer (thickness: 10 nm; not illustrated) formed from InGaAsP, and a p-InP cladding layer 115 (thickness: 0.2 µm) are grown in order.

Here, the present optical semiconductor device is designed such that the optical confinement coefficient of the MQW active layer 114 is approximately 0.05. Further, since, if the length L (cavity length) of the DFB laser region 101 is 300 µm, then the coupling coefficient is approximately $\kappa = 70 \text{ cm}^{-1}$ in the design just described, $\kappa L$ is $\kappa L$=approximately 2.1.

In this manner, the DFB laser region 101 and the photo detector region 105 having the same layer structure except whether or not the diffraction grating 112 is formed are formed.

Figure 2C:
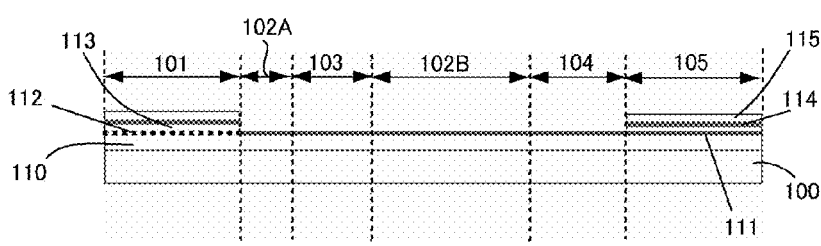

Then, in order to produce the first optical waveguide region 102A, optical coupler region 103, second optical waveguide region 102B and diffraction grating region 104, a mask is formed on the DFB laser region 101 and the photo detector region 105 and etching is carried out for a region other than the regions just described (for the first optical waveguide region 102A, optical coupler 103, second optical waveguide region 102B, diffraction grating region 104) until the etching reaches the n-InGaAsP layer 111 as illustrated in FIG. 2C.

Figure 2D:
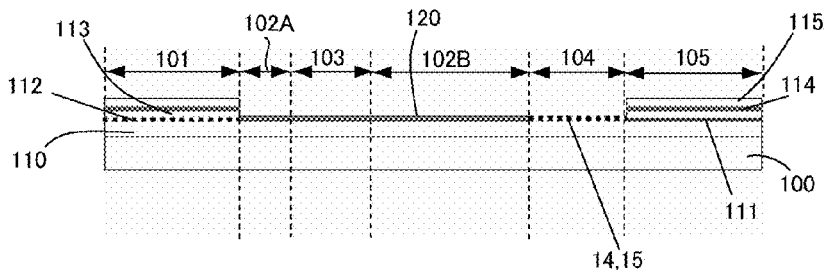

Then, an n-InGaAsP layer 120 having composition same as that of the n-InGaAsP layer 111 is additionally grown by a thickness of 0.05 µm on the n-InGaAsP layer 111 as illustrated in FIG. 2D.

Thereafter, as illustrated in FIG. 2D, the diffraction grating layers 14 and 15 (period of approximately 240 nm) are formed on the n-InGaAsP layers 111 and 120 of the diffraction grating region 104, for example, by EB exposure and dry etching or the like. It is to be noted that, since the n-InGaAsP layers 111 and 120 have the diffraction gratings 14 and 15 in the diffraction grating region 104 thereof, each of the n-InGaAsP layers 111 and 120 is hereinafter referred to sometimes as diffraction grating layer.

The diffraction grating 14 formed in such a manner as described above becomes a filter for carrying out wavelength monitoring. It is to be noted that, from a point of view of wavelength monitoring, since the accuracy of wavelength monitoring increases if the change ratio of the transmittance rate to the wavelength increases, it is preferable to form the diffraction grating 14 in the diffraction grating region 104 so that the Bragg wavelength by the diffraction grating 14 in the diffraction grating region 104 is displaced slightly from the Bragg wavelength (here, 1,550 nm) by the diffraction grating 112 drawn in the DFB laser region 101. Here, the Bragg wavelength by the diffraction grating 14 in the diffraction grating region 104 is set to 1,547.5 nm.

Figure 3:
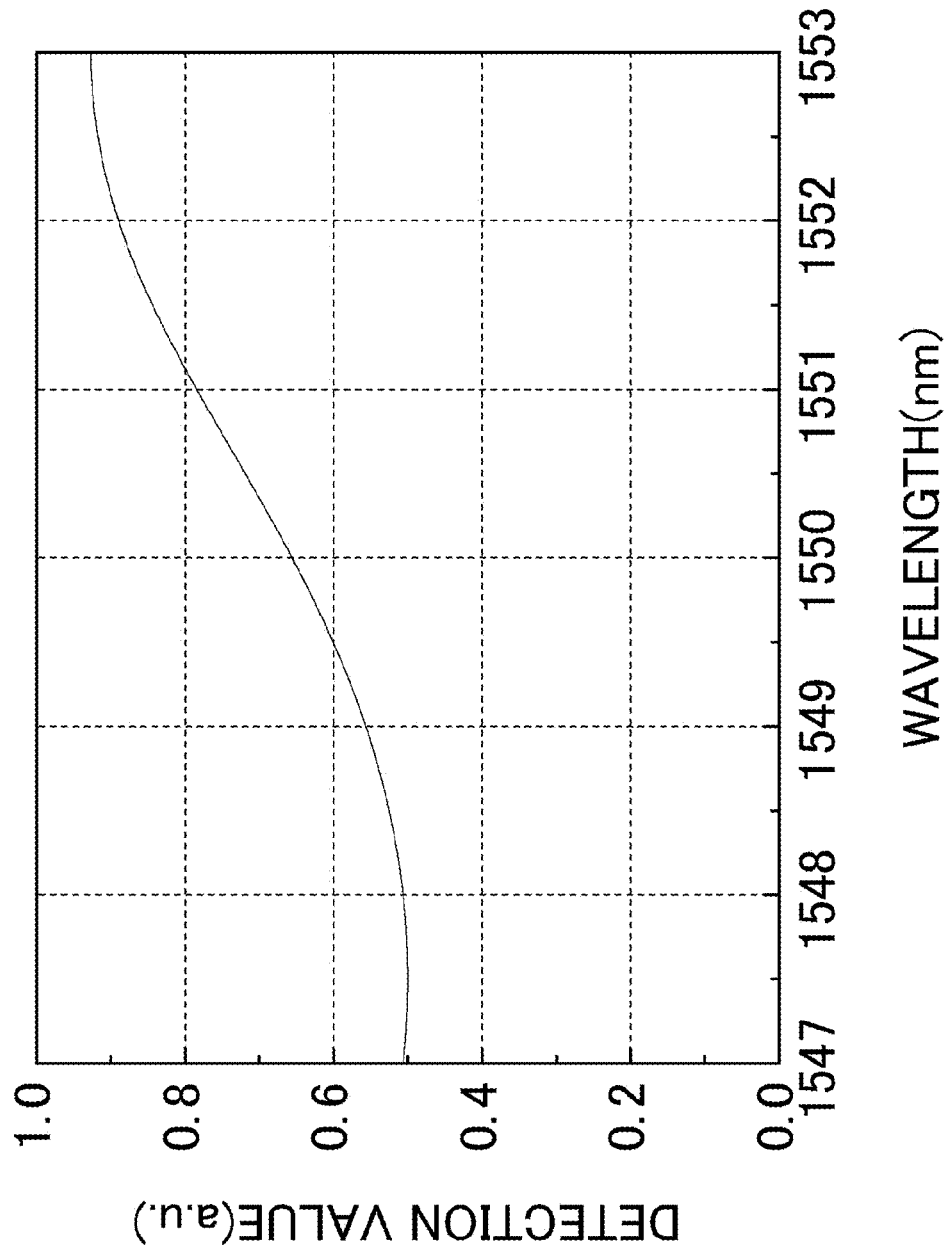
FIG. 3 is a diagram illustrating a relationship between the light intensity and the wavelength detected by a photo detector which is a component of the optical semiconductor device according to the first embodiment.

Since the detection value of the light intensity to be detected by the optical detector 16 of the optical semiconductor device configured in such a manner as described above depends upon the wavelength, for example, as illustrated in FIG. 3, a variation of the oscillation wavelength of the semiconductor laser 11 can be observed based on the variation of the detection value of the light intensity to be detected by the optical detector 16.

In the present embodiment, while the two diffraction gratings 14 and 15 are formed in the diffraction grating region 104 (refer to FIG. 1), in order to provide a difference between the optical path lengths of the reflection returning light from the diffraction gratings 14 and 15 side (here, set a difference between the waveguide lengths of the second optical waveguides 12B and 12C), one of the regions for forming the diffraction gratings is displaced to the photo detector region 105 side with respect to the other one of the regions for forming the diffraction gratings at the stage of the EB exposure and dry etching described above so that the ends of the diffraction gratings 14 and 15 on the photo detector region 105 side are displaced by ΔL satisfying the expression (1) give above. It is to be noted here that the diffraction gratings 14 and 15 are configured such that the periods and the duty ratios thereof are set equal to each other so that the optical characteristics of them become same as each other.

Figure 2E:
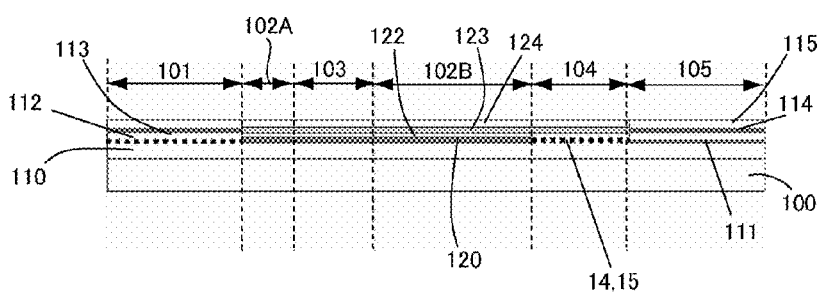

Then, as illustrated in FIG. 2E, an n-InP spacer layer 122 (thickness: 0.08 µm) is grown in the overall region on the n-InGaAsP layer 120 so that the diffraction gratings 14 and 15 are buried therein, and an i-InGaAsP core layer 123 ($\lambda_{PL}$=1.3 µm, thickness: 0.17 µm) and a p-InP cladding layer 124 (thickness: 0.2 µm) are grown in order.

Figure 2F:
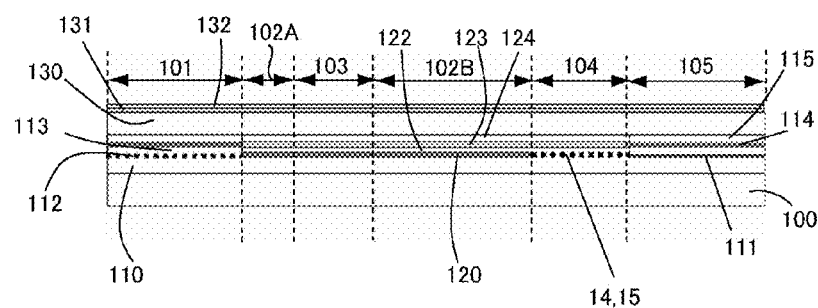

Then, the mask is removed entirely, and a p-InP cladding layer 130 (thickness: 1.5 µm), a p-InGaAsP quaternary contact layer 131 ($\lambda_{PL}$=1.3 µm, thickness: 0.15 µm) and a p-InGaAs ternary contact layer 132 (thickness: 0.3 µm) are stacked and grown in order in the overall region as illustrated in FIG. 2F.

Thereafter, an SiO$_2$ film is formed in the overall region in order to form mesa stripes and the SiO$_2$ film is suitably patterned to form a mesa stripe mask. Here, the patterning is carried out such that the width of the mesa stripe mask in the DFB laser region 101, first optical waveguide region 102A, second optical waveguide region 102B, diffraction grating region 104 and photo detector region 105 is 1.5 µm.

Then, a mesa stripe structure having the height of approximately 3.0 µm is formed by etching using the mesa stripe mask.

Then, the mesa stripe structure formed in such a manner as just described is buried in a semi-insulating InP layer (SI-InP layer; thickness: 3.0 µm) and then the epitaxial growth ends.

Thereafter, the p-side electrode is formed on the mesa stripe structure formed in the DFB laser region 101 and the photo detector region 105 by an electrode process used in a popular fabrication process for a semiconductor device and the n-side electrode is formed on the back face of the substrate so that such an optical semiconductor device as illustrated in FIG. 1 is produced.

Accordingly, with the optical semiconductor device according to the present embodiment, there is an advantage that the wavelength monitoring integrated optical semiconductor device (wavelength monitoring mechanism integrated semiconductor laser) of a small size and low power consumption wherein devices for monitoring the oscillation wavelength of the semiconductor laser 11 are monolithically integrated on the same substrate can be easily produced at a low cost and the influence of the reflection returning light to the semiconductor laser 11 can be reduced.

It is to be noted that, while, in the description above of the embodiment, a semiconductor device wherein InP semiconductor material systems are used as a semiconductor material is taken as an example, the present invention is not limited to this, and a different semiconductor material can be used.

Further, while, in the description above of the embodiment, a specific layer structure is taken as an example and particular values are presented regarding the thickness, composition and so forth, the layer structure and the values are not limited to those of the embodiment described above and are suitably designed in accordance with a desired application.

Further, while, in the description above of the embodiment, a semiconductor device wherein a DFB laser is used as the semiconductor laser 11 is taken as an example, the semiconductor laser 11 is not limited to this, and a different single-mode laser may be used.

Further, within a range within which no influence is had on extinction of the reflection returning light, a tunable laser capable of varying the oscillation wavelength may be used as the semiconductor laser 11.

Second Embodiment

Now, an optical semiconductor device according to a second embodiment is described with reference to FIG. 4.

The optical semiconductor device according to the present embodiment is different from that according to the first embodiment described above in that a light absorption region is provided.

Figure 4:
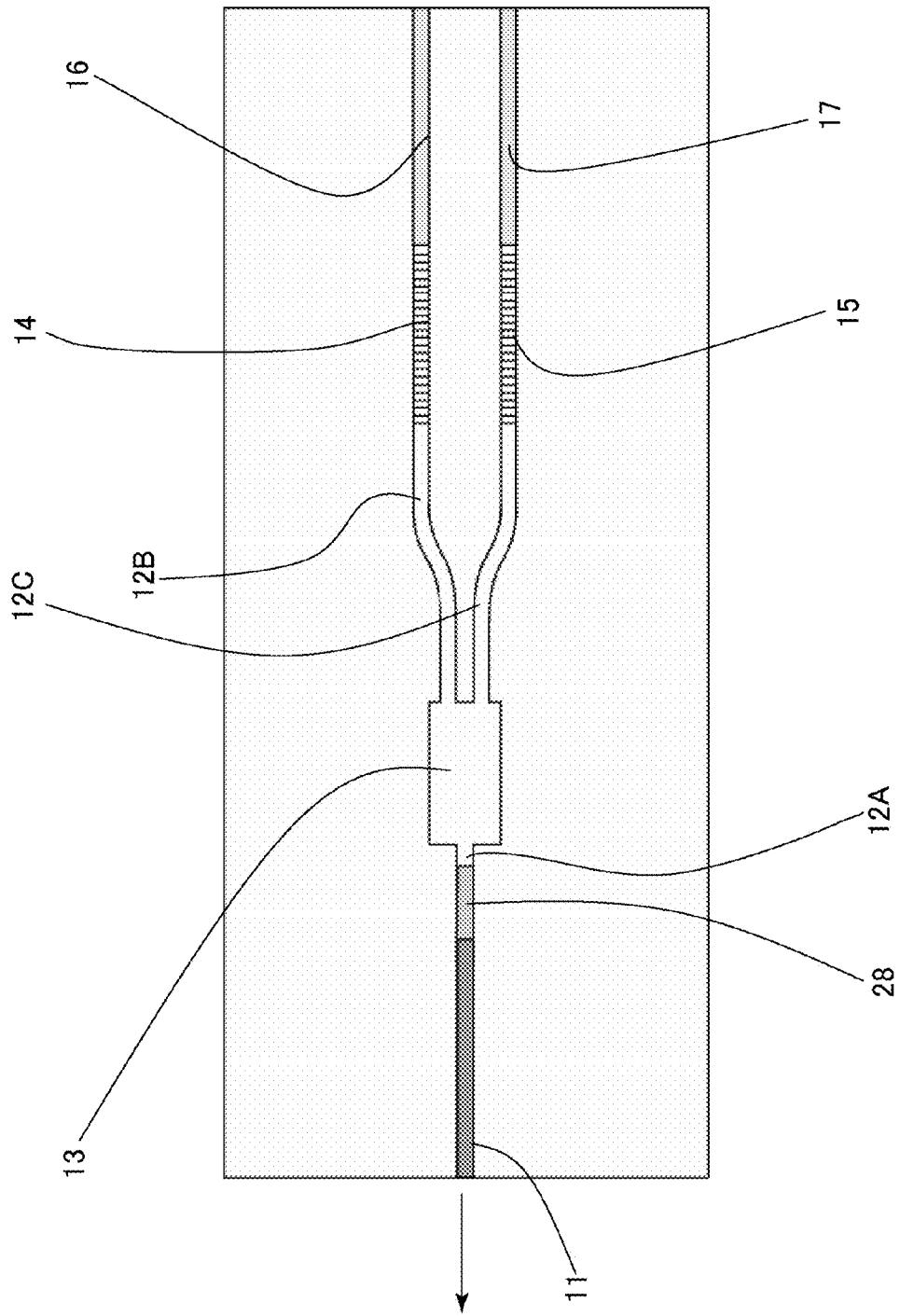
FIG. 4 is a schematic top plan view illustrating a configuration of an optical semiconductor device according to a second embodiment.

In particular, for example, as illustrated in FIG. 4, the present optical semiconductor device includes a semiconductor laser (here, DFB laser) 11, an optical waveguide (first optical waveguide) 12A, an optical coupler (photo coupler; for example, MMI coupler) 13, two optical waveguides (second optical waveguides) 12B and 12C, two diffraction gratings (wavelength filters) 14 and 15, an optical detector (photodetector) 16, a dummy optical detector (dummy photo detector) 17 and a light absorption region 28. The present optical semiconductor device is configured as a wavelength monitoring mechanism integrated semiconductor laser device (semiconductor integrated device) in which the components described above are monolithically integrated on the same substrate (semiconductor substrate). It is to be noted that like elements to those in the first embodiment described above (refer to FIG. 1) are denoted by like reference characters in FIG. 4.

Here, as illustrated in FIG. 4, the light absorption region 28 is provided between the semiconductor laser 11 and the optical coupler 13 so as to be capable of absorbing part of the output light from the semiconductor laser 11 such that the reflection returning light from the diffraction gratings 14 and 15 can be reduced further.

In particular, in the configuration of the first embodiment described above, although depending upon the light output of the semiconductor laser 11, while light having intensity of several mW is inputted to the photo detector 16, not very high light intensity is not required for identification of the signal light wavelength. Therefore, as illustrated in FIG. 4, the light absorption region 28 is provided between the semiconductor laser 11 and the optical coupler 13 to attenuate the output light from the semiconductor laser 11 so that surplus light is not supplied to the diffraction gratings 14 and 15. Consequently, the reflection returning light from the diffraction gratings 14 and 15 side is reduced.

It is to be noted that the attenuation amount by the light absorption region 28 can be adjusted by suitably designing, for example, the length of the light absorption region 28 in response to reflection returning light resistance of the semiconductor laser 11, required wavelength monitoring accuracy or the like.

Here, the light absorption region 28 is configured as a region having a layer structure similar to that of the photo detector 16. The light absorption region 28 may be produced at the same time with the semiconductor laser 11 and the photo detector 16 at the production step for the semiconductor 11 and the photo detector 16 in the fabrication method according to the first embodiment described above.

It is to be noted that, since the configuration of the other part and the fabrication method are same as those according to the first embodiment described above and a modification to the first embodiment, description of them is omitted here.

Accordingly, with the optical semiconductor device according to the present embodiment, there is an advantage that, similarly to the optical semiconductor device in the first embodiment described above, the wavelength monitoring integrated optical semiconductor device (wavelength monitoring mechanism integrated semiconductor laser) of a small size and low power consumption wherein devices for monitoring the oscillation wavelength of the semiconductor laser 11 are monolithically integrated on the same substrate can be easily produced at a low cost and the influence of the reflection returning light on the semiconductor laser 11 can be reduced. Particularly, with the optical semiconductor device according to the present embodiment, there is an advantage that the influence of reflection returning light on the semiconductor laser 11 can be reduced with a higher degree of certainty.

Third Embodiment

Now, an optical semiconductor device according to a third embodiment is described with reference to FIG. 5.

The optical semiconductor device according to the present embodiment is different from that according to the first embodiment described above in that output light from a semiconductor laser is outputted from an end face of a substrate on the opposite side.

Figure 5:
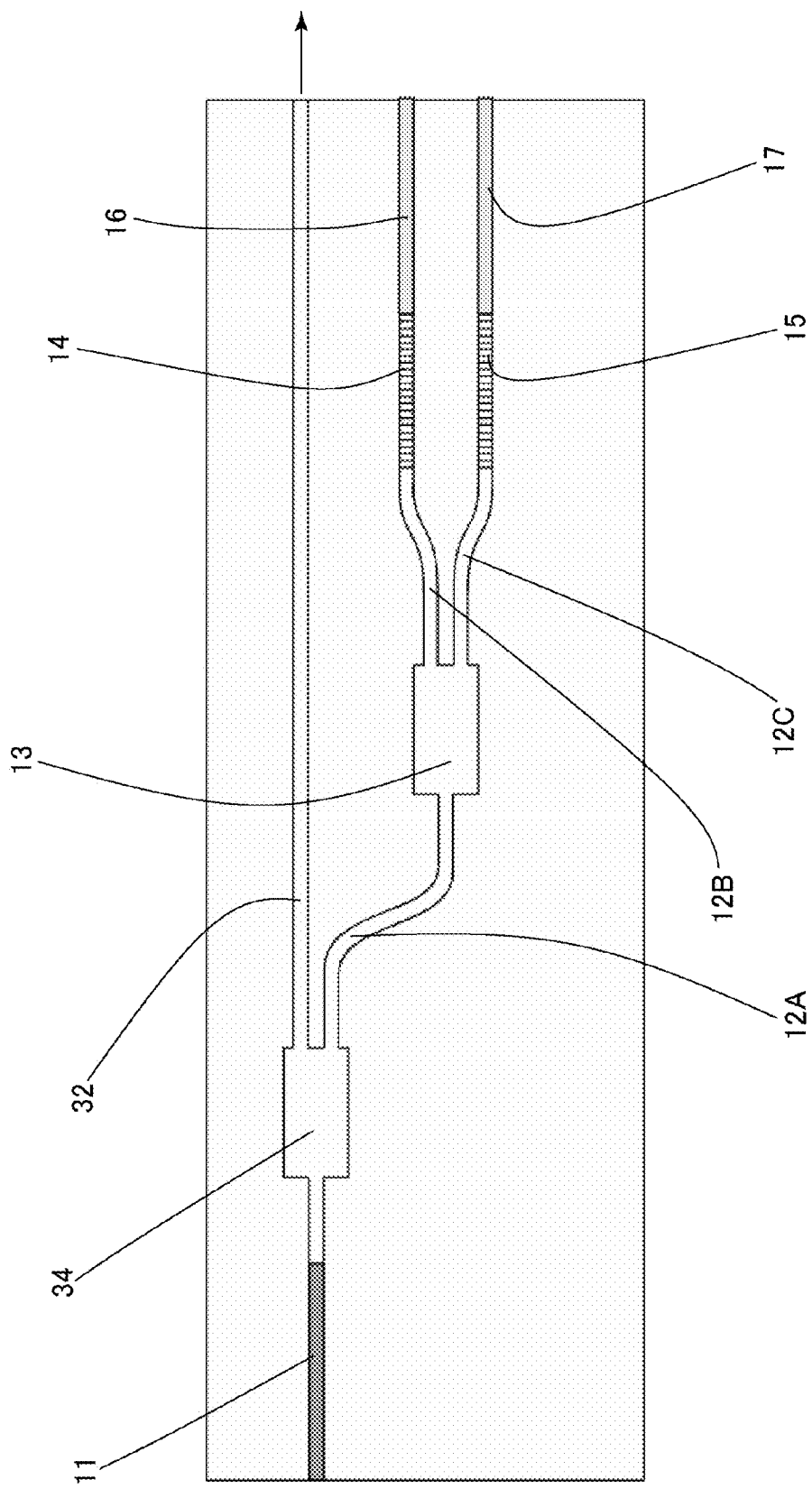
FIG. 5 is a schematic top plan view illustrating a configuration of an optical semiconductor device according to a third embodiment.

In particular, as illustrated in FIG. 5, the present optical semiconductor device includes a semiconductor laser (here, DFB laser) 11, an optical waveguide (first optical waveguide) 12A, an optical coupler (photo coupler; for example, MMI coupler) 13, two optical waveguides (second optical waveguides) 12B and 12C, two diffraction gratings (wavelength filters) 14 and 15, an optical detector (photo detector) 16, a dummy optical detector (dummy photo detector) 17, an outputting optical coupler (photo coupler; for example, MMI coupler) 34 and an outputting optical waveguide 32. The optical semiconductor device according to the present embodiment is configured as a wavelength monitoring mechanism integrated semiconductor laser device (semiconductor integrated device) wherein the components described above are monolithically integrated on the same substrate (semiconductor substrate). It is to be noted that like elements to those in the first embodiment described above (refer to FIG. 1) are denoted by like reference characters in FIG. 5.

Here, as illustrated in FIG. 5, the outputting optical coupler 34 is interposed in the first optical waveguide 12A for connecting the semiconductor laser 11 and the optical coupler 13. In particular, an input port of the outputting optical coupler 34 is connected to the semiconductor laser 11, and one of two output ports of the outputting optical coupler 34 is connected to the outputting optical waveguide 32 and the other one of the two output ports is connected to the first optical waveguide 12A. Then, by the outputting optical coupler 34, output light outputted from the semiconductor laser 11 is branched into two lights so that part of the output light is guided to a wavelength monitoring mechanism.

The outputting optical coupler 34 branches the output light (signal light) from the semiconductor laser 11 at a predetermined branching ratio (distribution ratio).

It is to be noted that it can be considered that equivalent loss is provided between the outputting optical waveguide 32 and the first optical waveguide 12A connected to the outputting optical coupler 34 by the outputting optical coupler 34. Therefore, depending upon the design of the branching ratio of the outputting optical coupler 34, it is possible to cause the outputting optical coupler 34 to function as the light absorption region in the second embodiment described above so that reflection returning light from the diffraction gratings 14 and 15 side is reduced.

As illustrated in FIG. 5, the outputting optical waveguide 32 extends from one of the output ports of the outputting optical coupler 34 to the end face of the substrate and output light outputted from the semiconductor laser 11 is outputted to the outside through the outputting optical waveguide 32.

It is to be noted that it can be considered that, in the present optical semiconductor device, an optical coupler (outputting optical coupler 34) for branching part of the output light from the semiconductor laser 11 is interposed in a main optical waveguide (outputting optical waveguide 32) for outputting the output light from the semiconductor laser 11 therefrom and a wavelength monitoring mechanism and a dummy structure are connected to the optical coupler 34. In this instance, since the first optical waveguide 12A and the second optical waveguides 12B and 12C guide part of the output light from the semiconductor laser 11 for wavelength monitoring, they are referred to as sub optical waveguide.

It is to be noted that, since the configuration of the other part and the fabrication method are same as those in the first embodiment described above and a modification to the first embodiment, description of them is omitted here.

Accordingly, with the optical semiconductor device according to the present embodiment, there is an advantage that, similarly to the optical semiconductor device in the first embodiment described above, the wavelength monitoring integrated optical semiconductor device (wavelength monitoring mechanism integrated semiconductor laser) of a small size and low power consumption wherein devices for monitoring the oscillation wavelength of the semiconductor laser 11 are monolithically integrated on the same substrate can be easily produced at a low cost and the influence of the reflection returning light on the semiconductor laser 11 can be reduced.

Particularly, while, in the optical semiconductor device according to the first embodiment described above, the output light (signal light) is extracted from one of the end faces of the semiconductor laser 11 and light outputted from the other one of the end faces is used for wavelength monitoring, in the optical semiconductor device according to the present embodiment, light outputted from one of the end faces of the semiconductor laser 11 is extracted as the output light (signal light) and is used also as wavelength detection signal light for wavelength monitoring, and the outputting optical waveguide 32 and the wavelength monitoring mechanism and dummy structure are disposed in parallel to each other as illustrated in FIG. 5. Therefore, for example, a different functional device (for example, a semiconductor optical amplifier, a modulator or the like) can be integrated halfway of the outputting optical waveguide (main waveguide) 32. Consequently, also there is an advantage that the device length can be reduced.

It is to be noted that, while the present embodiment is described as a modification to the first embodiment described above, the modification is not limited to this, and the optical semiconductor device in the present embodiment and the optical semiconductor device in the second embodiment described above can be combined. In this instance, the light absorption region may be provided between the outputting optical coupler 34 and the optical coupler 13.

Fourth Embodiment

Now, an optical semiconductor device according to a fourth embodiment is described with reference to FIG. 6.

The optical semiconductor device according to the present embodiment is different from that according to the third embodiment described above in that reflection light optical detectors for detecting reflection returning light from the diffraction grating side are provided.

Figure 6:
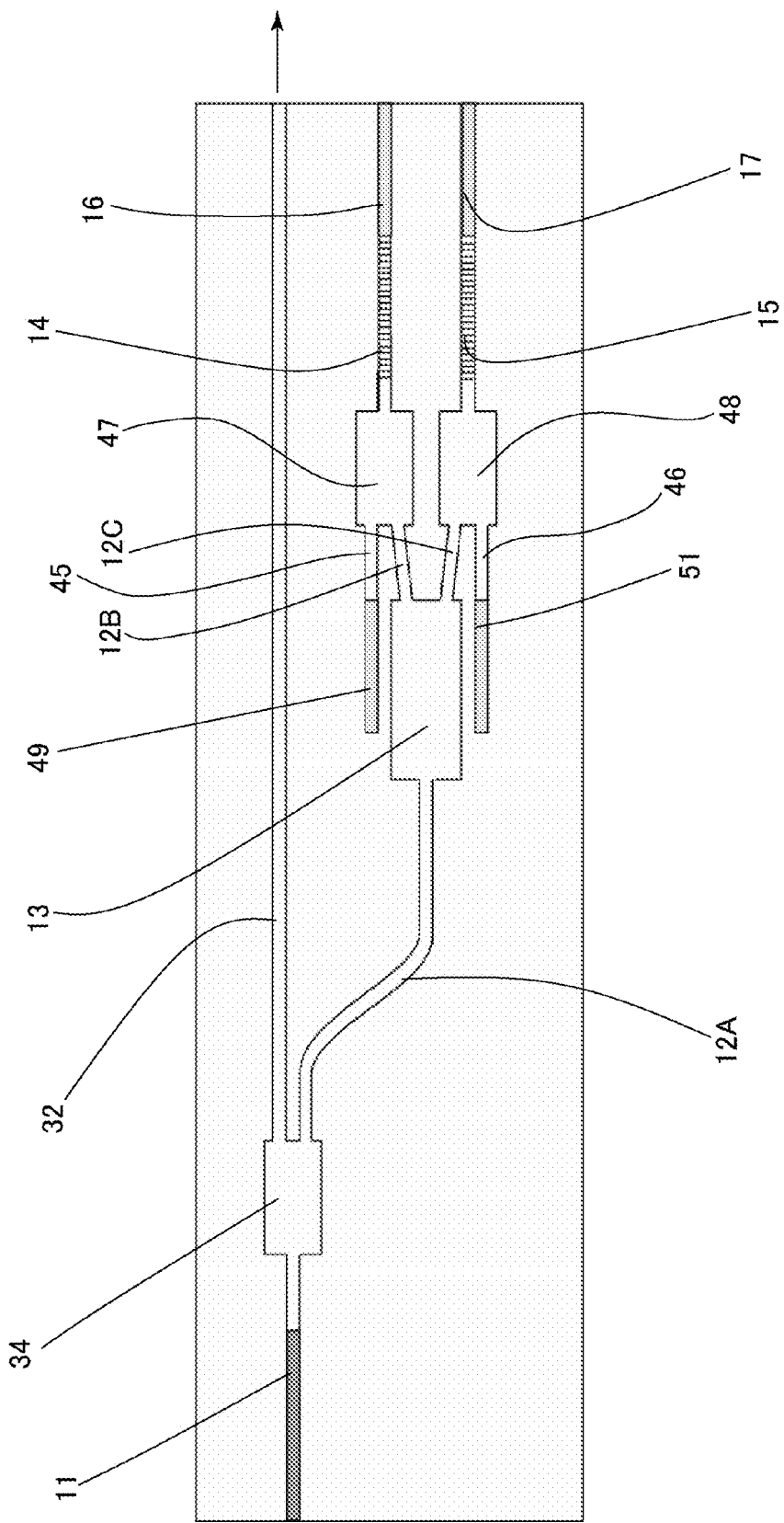
FIG. 6 is a schematic top plan view illustrating a configuration of an optical semiconductor device according to a fourth embodiment.

In particular, as illustrated in FIG. 6, the present optical semiconductor device includes a semiconductor laser (here, DFB laser) 11, an optical waveguide (first optical waveguide) 12A, an optical coupler (photo coupler; for example, MMI coupler) 13, two optical waveguides (second optical waveguides) 12B and 12C, two diffraction gratings (wavelength filters) 14 and 15, an optical detector (photo detector; optical detector for transmission light; transmission light detection photo detector) 16, a dummy optical detector (dummy photo detector) 17, an outputting optical coupler (photo coupler; for example, MMI coupler) 34, an outputting optical waveguide 32, reflection light optical couplers (photo couplers; for example, MMI couplers) 47 and 48, a reflection light optical detector (photo detector; reflection light detection photo detector) 49 and a dummy reflection light optical detector (dummy photo detector) 51. The present optical semiconductor device is configured as a wavelength monitoring mechanism integrated semiconductor laser device (semiconductor integrated device) wherein the components described above are monolithically integrated on the same substrate (semiconductor substrate). It is to be noted that like elements to those in the third embodiment described above (refer to FIG. 5) are denoted by like reference characters in FIG. 6.

Here, as illustrated in FIG. 6, the reflection light optical couplers 47 and 48 are interposed in the second optical waveguides 12B and 12C for connecting the optical coupler 13 and the diffraction gratings 14 and 15 to each other, respectively.

In particular, one of two ports provided on one side of the reflection light optical coupler 47 is connected to the optical coupler 13 and the other one of the two ports is connected to the reflection light optical detector 49, and a port provided on the other side of the optical coupler 47 is connected to the diffraction grating 14. Then, by the reflection light optical coupler 47, the reflection returning light from the diffraction grating 14 side is branched into two lights and part of the branched light (at least part of reflection light reflected by the diffraction grating 14) is guided to the reflection light optical detector 49.

Further, one of two ports provided on one side of the reflection light optical coupler 48 is connected to the optical coupler 13 and the other one of the two ports is connected to the dummy reflection light optical detector 51, and a port on the other side of the optical coupler 48 is connected to the diffraction grating 15. Then, by the reflection light optical coupler 48, the reflection returning light from the diffraction grating 15 side is branched into two lights, and part of the branched light (at least part of the reflection light reflected by the diffraction grating 15) is guided to the dummy reflection light optical detector 51.

Further, as illustrated in FIG. 6, the reflection light optical detector 49 is connected to the reflection light optical coupler 47 through the optical waveguide 45. Then, the intensity of the reflection returning light from the diffraction grating 14 side (including at least reflection light reflected by the diffraction grating 14) is detected by the reflection light optical detector 49.

Further, as illustrated in FIG. 6, the dummy reflection light optical detector 51 has a structure same as that of the reflection light optical detector 49 and is provided in a region to which the reflection returning light from the diffraction grating 15 side (including at least reflection light reflected by the diffraction grating 15) is inputted. In particular, the dummy reflection light optical detector 51 is connected to the reflection light optical coupler 48 through the optical waveguide 46.

Then, the intensity of the transmission light transmitted through the diffraction grating 14 is detected by the transmission light detection photo detector 16 and the intensity of the reflection returning light from the diffraction grating 14 side (including at least reflection light reflected by the diffraction grating 14) is detected by the reflection light detection photo detector 49 such that control of the oscillation wavelength of the semiconductor laser 11 (including control for fixing the oscillation wavelength) is carried out based on the detected values (for example, based on a calculation value calculated by mathematical operation of the difference between the detection values or the ratio between the detection values).

It is to be noted that, since the configuration of the other part and the fabrication method are same as those in the first embodiment, modification to the first embodiment and third embodiment described above, description thereof is omitted here.

Accordingly, with the optical semiconductor device according to the present embodiment, there is an advantage that, similarly to the optical semiconductor device according to the third embodiment described above, the wavelength monitoring integrated optical semiconductor device (wavelength monitoring mechanism integrated semiconductor laser) of a small size and low power consumption wherein devices for monitoring the oscillation wavelength of the semiconductor laser 11 are monolithically integrated on the same substrate can be easily produced at a low cost and the influence of the reflection returning light on the semiconductor laser 11 can be reduced.

Particularly, with the optical semiconductor device according to the present embodiment, also there is an advantage that a higher degree of wavelength monitoring accuracy is obtained by using a detection value of the transmission light intensity transmitted through the diffraction grating 14 and a detection value of the intensity of the reflection returning light (including at least the reflection light reflected by the diffraction grating 14) from the diffraction grating 14 side (that is, by calculating and using the difference between the detection values or the ratio between the detection values).

Figure 7:
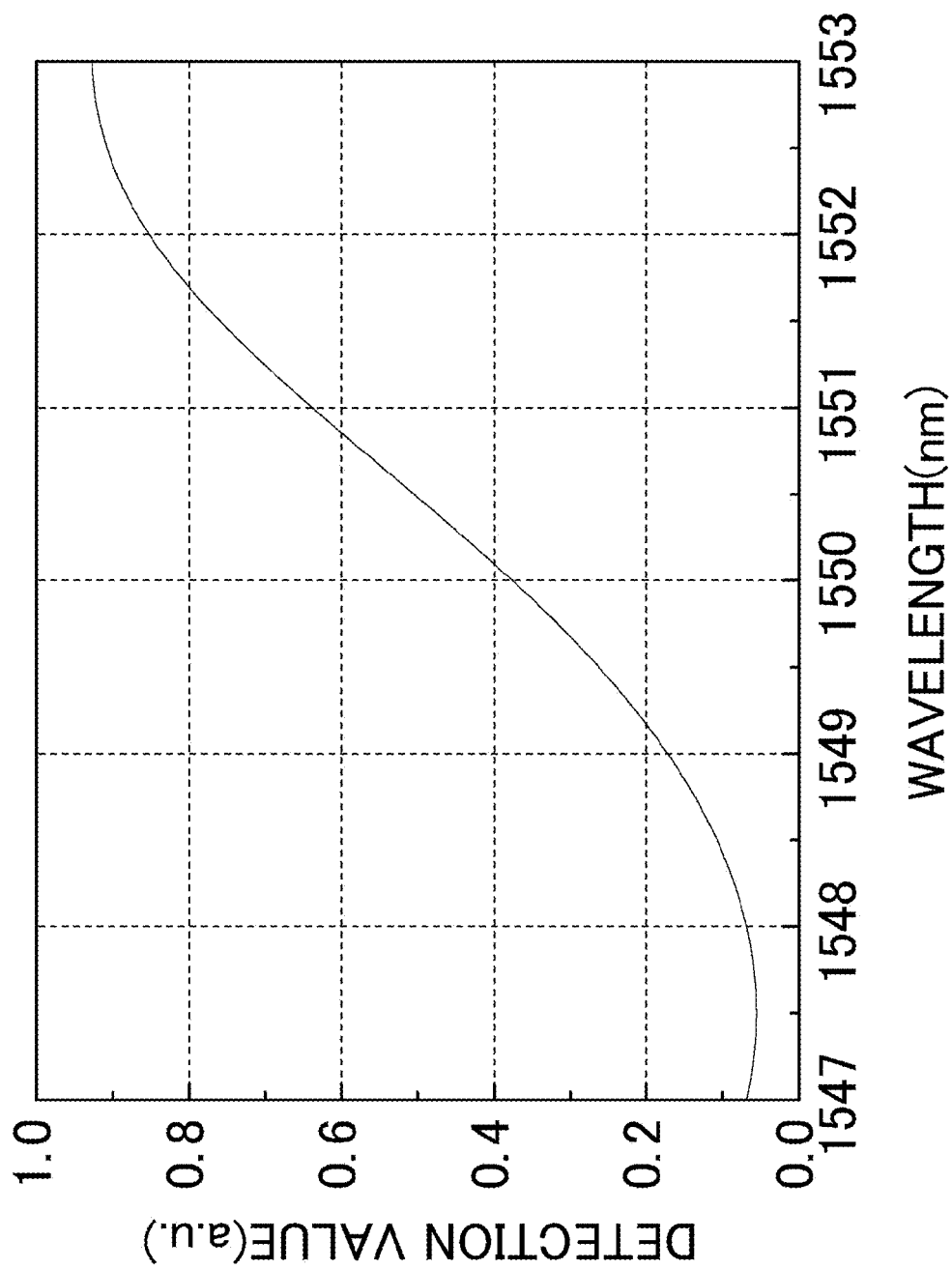
FIG. 7 is a diagram illustrating a relationship between the differential intensity between the light intensity detected by a reflection light detection photo detector and the light intensity detected by a transmission light detection photo detector and a wavelength, and wherein the photo detectors compose the optical semiconductor device according to the fourth embodiment.

Here, FIG. 7 illustrates a relationship between a calculation value, which is the differential between a detection value of the transmission light intensity detected by the transmission light detection photo detector and a detection value of the reflection light intensity detected by the reflection light detection photo detector, and a wavelength.

As illustrated in FIG. 7, since the difference calculation value (differential intensity) exhibits a more steeply varying value with respect to the variation of the wavelength, a higher degree of wavelength monitoring accuracy is obtained.

It is to be noted that, while the present embodiment is described as a modification to the third embodiment described above, the modification is not limited to this, and the optical semiconductor device in the present embodiment and the optical semiconductor device in the second embodiment described above can be combined. In this instance, the light absorption region may be provided between the outputting optical coupler 34 and the optical coupler 13.

Fifth Embodiment

Now, an optical semiconductor device according to a fifth embodiment is described with reference to FIG. 8.

The optical semiconductor device according to the present embodiment is different from that according to the fourth embodiment described above in that an output light optical detector for detecting output light outputted from the semiconductor laser is provided.

Figure 8:
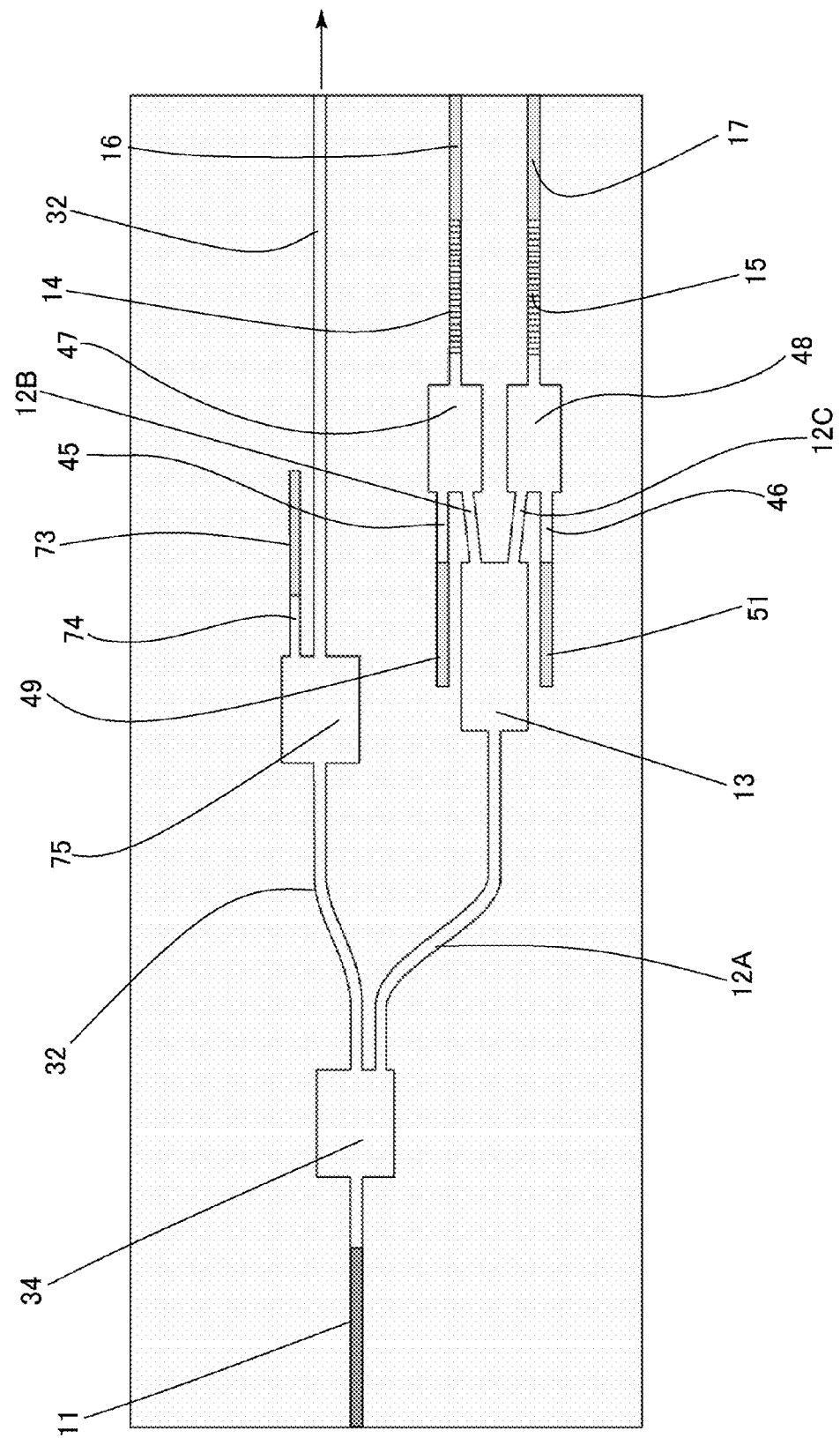
FIG. 8 is a schematic top plan view illustrating a configuration of an optical semiconductor device according to a fifth embodiment.

In particular, as illustrated in FIG. 8, the present optical semiconductor device includes a semiconductor laser (here, DFB laser) 11, an optical waveguide (first optical waveguide) 12A, an optical coupler (photo coupler; for example, MMI coupler) 13, two optical waveguides (second optical waveguides) 12B and 12C, two diffraction gratings (wavelength filters) 14 and 15, an optical detector (photo detector; transmission light optical detector; transmission light detection photo detector) 16, a dummy optical detector (dummy photo detector) 17, an outputting optical coupler (photo coupler; for example, MMI coupler) 34, an outputting optical waveguide 32, reflection light optical couplers (photo couplers; for example, MMI couplers) 47 and 48, a reflection light optical detector (photodetector; reflection light detection photo detector) 49, a dummy reflection light optical detector (dummy photo detector) 51, an output light detection optical coupler (photo coupler; for example, MMI coupler) 75 and an output light detection optical detector [photo detector; output light (semiconductor laser light) detection photo detector] 73. The present optical semiconductor device is configured as a wavelength monitoring mechanism integrated semiconductor laser device (semiconductor integrated device) wherein the components described above are monolithically integrated on the same substrate (semiconductor substrate). It is to be noted that like elements to those in the fourth embodiment described above (refer to FIG. 6) are denoted like reference characters in FIG. 8.

Here, as illustrated in FIG. 8, the output light detection optical coupler 75 is interposed in the outputting optical waveguide 32 extending from the outputting optical coupler 34 to the end face of the substrate. In particular, one of two ports on one side of the output light detection optical coupler 75 is connected to one side portion of the outputting optical waveguide 32 and the other one of the two ports is connected to the output light detection optical detector 73, and a port on the other side of the output light detection coupler 75 is connected to the other side portion of the outputting optical waveguide 32. Then, by the output light detection optical coupler 75, the output light guided from the semiconductor laser 11 through the output optical waveguide 32 is branched into two lights, and part of the branched light is guided to the output light detection optical detector 73.

Further, as illustrated in FIG. 8, the output light detection optical detector 73 is connected to the output light detection optical coupler 75 through the optical waveguide 74. Thus, the intensity of the output light (laser light) outputted from the semiconductor laser 11 is detected by the output light detection optical detector 73.

Consequently, the intensity (laser light intensity; light output) of the output light outputted from the semiconductor laser 11 can be directly detected and the variation of the intensity can be monitored.

Then, the intensity of the transmission light transmitted through the diffraction grating 14 is detected by the transmission light detection photo detector 16 and the intensity of reflection returning light (including at least reflection light reflected by the diffraction grating 14) from the diffraction grating 14 side is detected by the reflection light detection photo detector 49 and then the intensity of the output light from the semiconductor laser 11 is detected by the output light detection photo detector 73 such that control of the oscillation wavelength of the semiconductor laser 11 is carried out based on the detected intensities.

Here, the difference between the detection value of the transmission light detection photo detector 16 and the detection value of the reflection light detection photo detector 49 (or the ratio between the detection values) is calculated such that the control (including also control for fixing the oscillation wavelength) of the oscillation wavelength of the semiconductor laser 11 is carried out based on the ratio between the calculation value and the detection value of the output light detection photo detector 73.

It is to be noted that, since the configuration of the other part and the fabrication method are same as those in the first embodiment, modification to the first embodiment, third embodiment and fourth embodiment described above, description is omitted here.

Accordingly, with the optical semiconductor device according to the present embodiment, there is an advantage that, similarly to the optical semiconductor device according to the fourth embodiment described above, the wavelength monitoring integrated optical semiconductor device (wavelength monitoring mechanism integrated semiconductor laser) of a small size and low power consumption wherein devices for monitoring the oscillation wavelength of the semiconductor laser 11 are monolithically integrated on the same substrate can be easily produced at a low cost and the influence of the reflection returning light on the semiconductor laser 11 can be reduced.

Particularly, in the optical semiconductor device according to the present embodiment, it is possible, based on light output information including wavelength information and obtained from detection values of transmission light and reflection light from the diffraction grating 14, not only to identify the oscillation wavelength of the semiconductor laser 11 (oscillation wavelength of signal light) but also to monitor the variation of the intensity of the output light from the semiconductor laser 11. Therefore, there is an advantage that it can be detected whether a variation of the oscillation wavelength of the semiconductor laser 11 is caused by an output variation or an oscillation wavelength variation and it can be prevented that, for example, when only the intensity of the output light of the semiconductor laser 11 varies while the oscillation wavelength of the semiconductor laser 11 does not vary, an erroneous decision is made that the oscillation wavelength of the semiconductor 11 varies and consequently a desired oscillation wavelength can be maintained.

It is to be noted that, while the present embodiment is described as a modification to the fourth embodiment described above, the modification is not limited to this, and, for example, the configuration according to the present embodiment can be also applied to the third embodiment described above. Also the configuration in the present embodiment and the configuration in the second embodiment described above can be combined. In this instance, the light absorption region may be provided between the outputting optical coupler 34 and the optical coupler 13.

Sixth Embodiment

Now, an optical semiconductor device according to a sixth embodiment is described with reference to FIG. 9.

While the optical semiconductor device according to the first embodiment is configured such that the waveguide lengths of the second optical waveguides 12B and 12C are different from each other and the optical path length difference of reflection returning light is varied to adjust the phase, the optical semiconductor device according to the present embodiment is configured such that the equivalent refractive indices of the second optical waveguides 12B and 12C are different from each other and the optical path length difference of reflection returning light is varied to adjust the phase. In particular, since the optical path length is represented by the product of the equivalent refractive index and the length of the optical waveguide, in the present embodiment, the phase is adjusted by adjusting the equivalent refractive indices of the second optical waveguides 12B and 12C to vary the optical path lengths.

Figure 9:
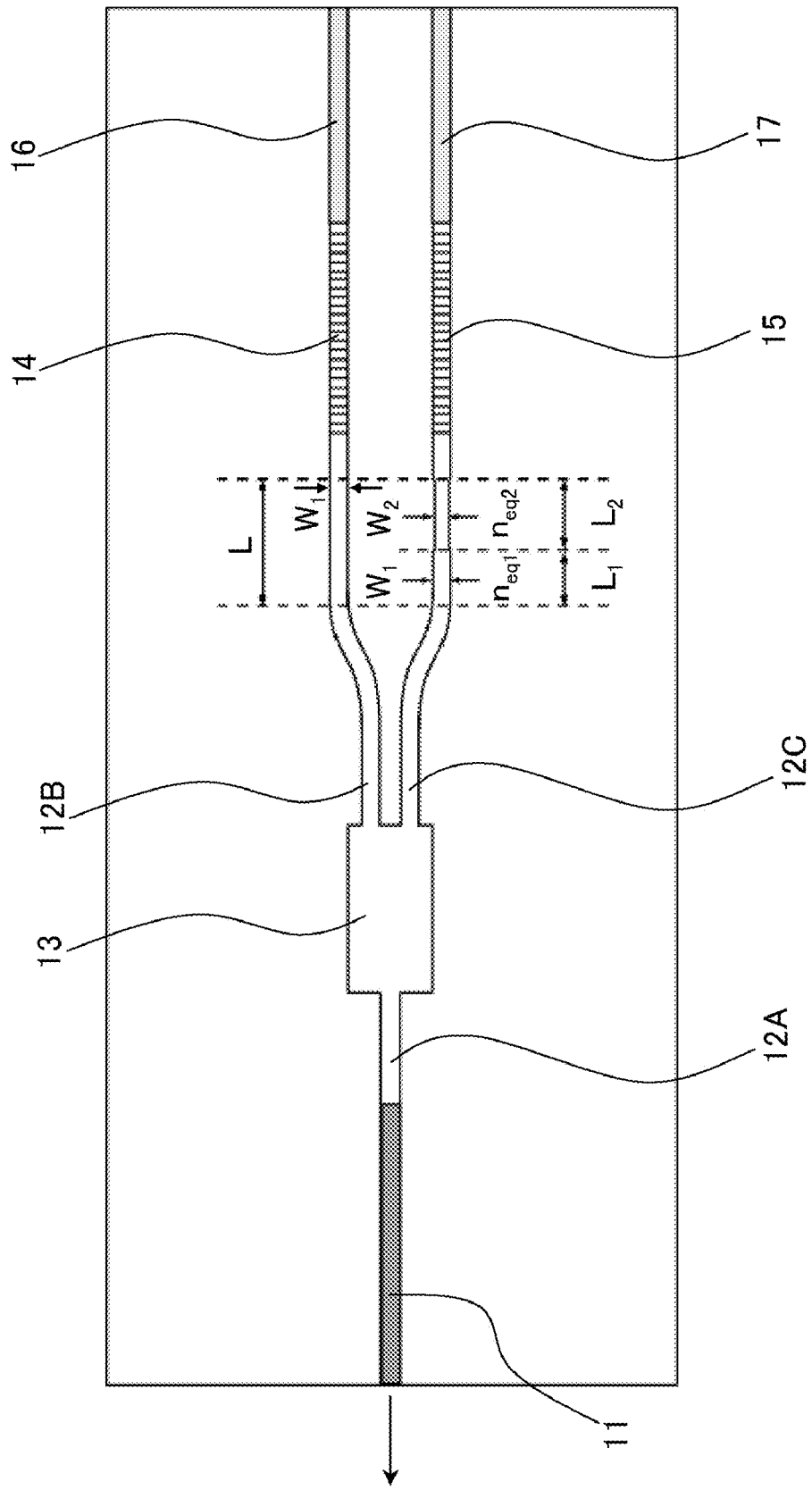
FIG. 9 is a schematic top plan view illustrating a configuration of an optical semiconductor device according to a sixth embodiment.

In particular, in the present embodiment, the waveguide lengths of the second optical waveguides 12B and 12C are set so as to be same as each other and one of the two second optical waveguides 12B and 12C has a portion at which the width is different from that at the other portion, for example, as illustrated in FIG. 9.

In particular, for example, as illustrated in FIG. 9, the present optical semiconductor device includes a semiconductor laser (here, DFB laser) 11, an optical waveguide (first optical waveguide) 12A connected to the semiconductor laser 11, an optical coupler (photo coupler; for example, MMI coupler) 13 connected to the optical waveguide 12A, two optical waveguides (second optical waveguides) 12B and 12C connected to the optical coupler 13, diffraction gratings (wavelength filters) 14 and 15 provided on the two optical waveguides 12B and 12C, respectively, an optical detector (photo detector) 16 provided in the proximity of the diffraction grating 14 and a dummy optical detector (dummy photo detector) 17 provided in the proximity of the diffraction grating 15. The present optical semiconductor device is configured as a wavelength monitoring mechanism integrated semiconductor laser device (semiconductor integrated device) wherein the components described above are monolithically integrated on the same substrate (semiconductor substrate). It is to be noted that like elements to those in the first embodiment described above (refer to FIG. 1) are denoted by like reference characters in FIG. 9.

Particularly, one of the second optical waveguides 12B and 12C connected to the diffraction gratings 14 and 15, respectively, has a portion at which the width is different from that of the other portion such that the phase difference of the reflection returning light becomes $\pi$.

In particular, the optical path length of the second optical waveguide 12C is adjusted with respect to the optical path length of the second optical waveguide 12B so that the phase difference between the reflection returning lights becomes $\pi$.

First, the second optical waveguide 12B has the same width $W_1$ along the overall length thereof, and the optical path length (optical length) $L_{opt1}$ is represented by an expression (2) given below where the equivalent refractive index is $n_{eq1}$ and the length of a predetermined region is L:

$$L_{opt1} = L \cdot n_{eq1} \quad (2)$$

On the other hand, the second optical waveguide 12C has a portion of the width $W_2$ different from the width $W_1$ of the second optical waveguide 12B, and the optical path length $L_{opt2}$ of the second optical waveguide 12C is represented by an expression (3) given below where the equivalent refractive index of the region of the width $W_1$ is $n_{eq1}$, the equivalent refractive index of the region of the width $W_2$ is $n_{eq2}$, the length of the region of the width $W_1$ is $L_1$, and the length of the region of the width $W_2$ is $L_2$:

$$L_{opt2} = L_1 \cdot n_{eq1} + L_2 \cdot n_{eq2} \quad (3)$$

It is to be noted that the length L of the predetermined region of the second optical waveguide 12B and the total length of the length $L_1$ of the region of the width $W_1$ and the length $L_2$ of the region of the width $W_2$ of the second optical waveguide 12C are equal to each other ($L_1+L_2=L$). In particular, the overall length (physical length) of the second optical waveguide 12B and the overall length (physical length) of the other second optical waveguide 12C are equal to each other.

In this instance, the difference $\Delta L_{opt}$ between the optical path lengths of the second optical waveguide 12B and the other second optical waveguide 12C is represented by an expression (4) given below:

$$\Delta L_{opt} = L_{opt1} - L_{opt2} \qquad (4)$$
$$= L \cdot n_{eq1} - (L_1 \cdot n_{eq1} + L_2 \cdot n_{eq2})$$
$$= L_2 \cdot (n_{eq1} - n_{eq2})$$

By setting the optical path length difference $\Delta L_{opt}$ such that an expression (5) given below is satisfied, the phase difference between the reflection returning lights from the diffraction gratings 14 and 15 side at the optical coupler portion can be made equal to $\pi$. Consequently, the phase difference becomes $\pi$ when the reflection returning lights are multiplexed at the optical coupler 13 and then extinction is caused by the interference.

$$\Delta L_{opt} = L_2(n_{eq1} - n_{eq2}) \qquad (5)$$
$$= \frac{\lambda}{2}\left(m + \frac{1}{2}\right)$$

(m: integer number)

It is to be noted that, since, where the width of the optical waveguide is varied, if the width is varied steeply and stepwise, then reflection occurs at the varied portion, it is preferable to apply, for example, a tapering structure or the like.

It is to be noted that, since the configuration of the other part and the fabrication method are same as those in the first embodiment and the modification to the first embodiment described above, description of them is omitted here.

Accordingly, with the optical semiconductor device according to the present embodiment, there is an advantage that, similarly to the optical semiconductor device in the first embodiment described above, the wavelength monitoring integrated optical semiconductor device (wavelength monitoring mechanism integrated semiconductor laser) of a small size and low power consumption wherein devices for monitoring the oscillation wavelength of the semiconductor laser 11 are monolithically integrated on the same substrate can be easily produced at a low cost and the influence of the reflection returning light on the semiconductor laser 11 can be reduced.

Particularly, with the optical semiconductor device according to the present embodiment, there is an advantage that, since the difference in the equivalent refractive index by the difference in the width of the optical waveguide is utilized, the optical path length can be easily adjusted only if the widths (mesa widths) of the second optical waveguides 12B and 12C are designed.

It is to be noted that, while, in the embodiment described above, one of the two second optical waveguides 12B and 12C has the portion at which the width is different from that at the other portion in order that the equivalent refractive indices of the second optical waveguides 12B and 12C become different from each other, the configuration for the adjustment is not limited to this. For example, the equivalent refractive indices can be adjusted also by design of a layer structure of the second optical waveguides 12B and 12C such as the thickness, material and composition and so forth.

Further, while the waveguide lengths (physical length) of the second optical waveguides 12B and 12C are set equal to each other for simplification of the description of the embodiment given above, they need not be set equal to each other. For example, the configuration in the present embodiment and the configuration in the first embodiment described above may be combined with each other to vary the optical path length difference between the reflection returning lights to adjust the phase. In particular, in order to vary the optical path length difference between the reflection returning lights to adjust the phase, the waveguide lengths are set so that the optical path length difference satisfies the expression (1) given herein above and the waveguide lengths of the second optical waveguides 12B and 12C are different from each other, and the equivalent refractive indices are set so that the optical path length difference satisfies the expression (5) given above and the equivalent refractive indices of the second optical waveguides 12B and 12C are different from each other.

It is to be noted that, while the present embodiment is described as a modification to the first embodiment described above, the present invention is not limited to this, and, for example, the configuration according to the present embodiment may be applied to the optical semiconductor devices in the second to fifth embodiments described above.

Seventh Embodiment

Now, an optical semiconductor device according to a seventh embodiment is described with reference to FIG. 10.

While the optical semiconductor device according to the first embodiment described above is configured such that the waveguide lengths of the second optical waveguides 12B and 12C are different from each other and the optical path length difference between reflection returning lights is varied to adjust the phase, the optical semiconductor device according to the present embodiment is configured such that a phase shifter is provided on one of the second optical waveguides 12B and 12C (here, on the second optical waveguide 12C) and the phase shifter is adjusted so that the phases of the reflection returning lights from the diffraction grating side are displaced from each other by $\pi$ at an optical coupler portion.

Figure 10:
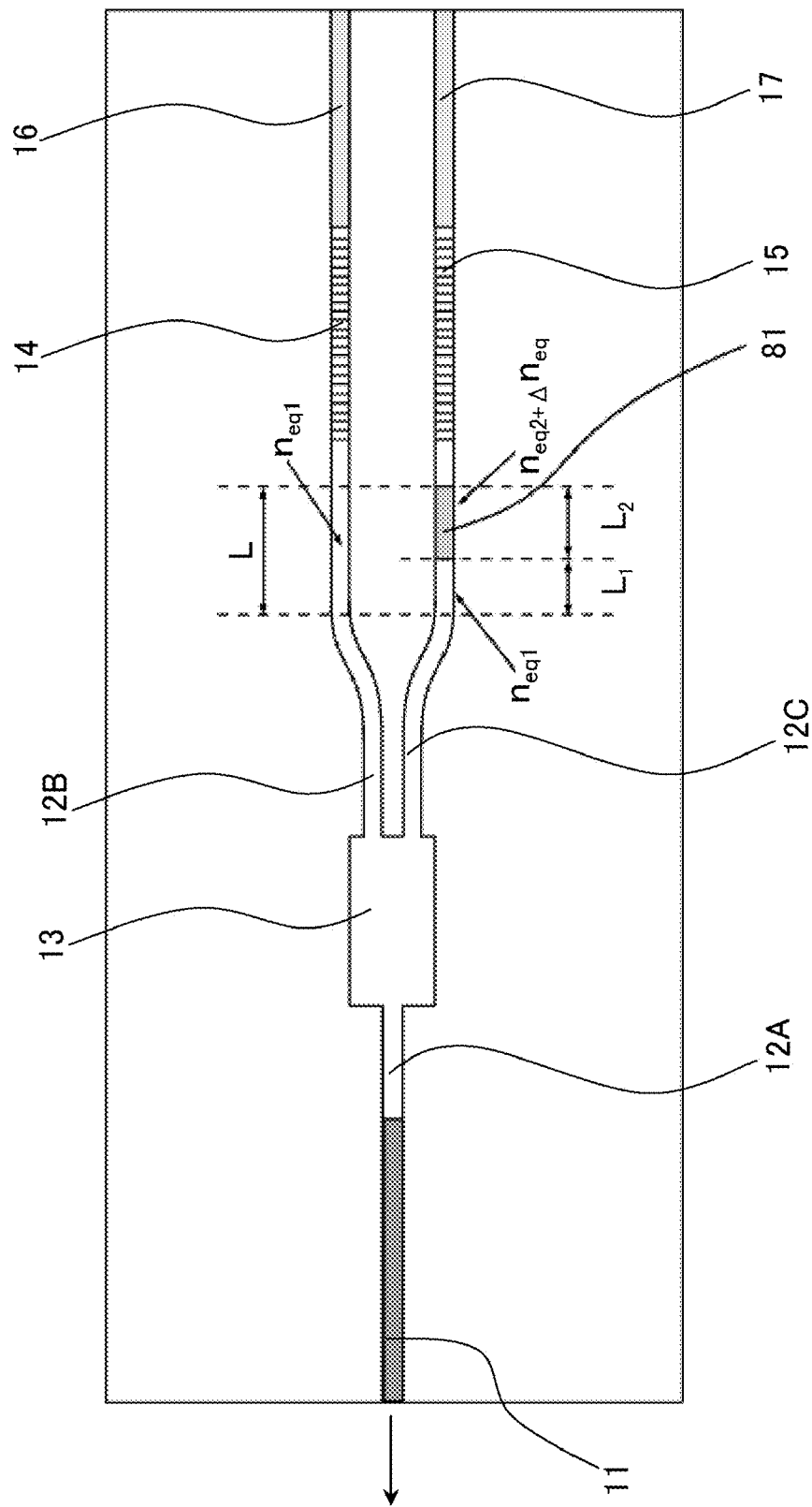
FIG. 10 is a schematic top plan view illustrating a configuration of an optical semiconductor device according to a seventh embodiment.

In particular, in the present embodiment, for example, as illustrated in FIG. 10, the waveguide lengths of the second optical waveguides 12B and 12C are set equal to each other and a phase shifter 81 is provided on one of the two second optical waveguides 12B and 12C (here, on the second optical waveguide 12C).

In particular, as illustrated in FIG. 10, the present optical semiconductor device includes a semiconductor laser (here, DFB laser) 11, an optical waveguide (first optical waveguide) 12A connected to the semiconductor laser 11, an optical coupler (photo coupler; for example, MMI coupler) 13 connected to the optical waveguide 12A, two optical waveguides (second optical waveguides) 12B and 12C connected to the optical coupler 13, diffraction gratings (wavelength filters) 14 and 15 provided on the two optical waveguides 12B and 12C, respectively, an optical detector (photo detector) 16 provided in the proximity of the diffraction grating 14, a dummy optical detector (dummy photo detector) 17 provided in the proximity of the diffraction grating 15 and a phase shifter 81. The optical semiconductor device is configured as a wavelength monitoring mechanism integrated semiconductor laser device (semiconductor integrated device) wherein the components described above are monolithically integrated on the same substrate (semiconductor substrate). It is to be noted that like elements to those in the first embodiment described above (refer to FIG. 1) are denoted by like reference characters in FIG. 10.

Particularly, one of the second optical waveguides 12B and 12C (here, the second optical waveguide 12C) connected to the diffraction gratings 14 and 15, respectively, includes the phase shifter 81 so that the phase difference between reflection returning lights may become π.

Here, the phase shifter 81 is easily produced by forming an electrode in a desired region of the optical waveguide (here, in a desired region of the second optical waveguide 12C) so that phase adjustment (shift) is carried out by injection of current into or application of a voltage to the optical waveguide. It is to be noted that one of the second optical waveguides 12B and 12C (here, the second optical waveguide 12C) has a portion capable of controlling the refractive index by current injection or voltage application. It is to be noted that the configuration of the phase shifter is not limited to this.

Then, the phase shifter 81 of the second optical waveguide 12C is adjusted with respect to the optical path length of the second optical waveguide 12B (that is, current to be injected into or a voltage to be applied to the phase shifter 81) to vary the refractive index (equivalent refractive index) of the second optical waveguide 12C in the phase shifter region so that the phase difference of the reflection returning light may become π.

First, the optical path length (optical length) $L_{opt1}$ of the second optical waveguide 12B is represented by an expression (6) given below where the equivalent refractive index is $n_{eq1}$ and the length of the predetermined region is L:

$$L_{opt1} = L \cdot n_{eq1} \tag{6}$$

On the other hand, the second optical waveguide 12C includes the phase shifter 81, and the optical path length $L_{opt2}$ is represented by an expression (7) given below where the length of a region other than the phase shifter 81 within the predetermined region (length L), the length of the phase shifter 81 and the equivalent refraction index of the region other than the phase shifter 81 are represented by $L_1$, $L_2$ and $n_{eq1}$, respectively, and the equivalent refractive index of the phase shifter 81 is represented by $n_{eq1}+\Delta n_{eq}$. Here, $\Delta n_{eq}$ indicates a variation amount of the refractive index in the phase shifter 81.

$$L_{eq2} = L_1 \cdot n_{eq1} + L_2(n_{eq2}+\Delta n_{eq}) \tag{7}$$

It is to be noted that the length L of the predetermined region of the second optical waveguide 12B and the total length of the length $L_1$ of the region other than the phase shifter 81 and the length $L_2$ of the phase shifter 81 of the second optical waveguide 12C are equal to each other ($L_1+L_2=L$). In other words, the overall length (physical length) of the second optical waveguide 12B and the overall length (physical length) of the other second optical waveguide 12C are equal to each other.

In this instance, the difference $\Delta L_{opt}$ between the optical path lengths of the second optical waveguide 12B and the other second optical waveguide 12C is represented by an expression (8) given below:

$$\begin{aligned}\Delta L_{opt} &= L_{opt1} - L_{opt2} \\ &= L \cdot n_{eq1} - [L_1 \cdot n_{eq1} + L_2 \cdot (n_{eq2}+\Delta n_{eq})] \\ &= L_2 \cdot (n_{eq1} - n_{eq2} - \Delta n_{eq})\end{aligned} \tag{8}$$

By setting the optical path length difference $\Delta L_{opt}$ so as to satisfy an expression (9) given below, the phase difference between the reflection returning lights from the diffraction gratings 14 and 15 side at the optical coupler portion can be set to π. Consequently, the phase difference becomes π when the reflection returning lights are multiplexed at the optical coupler 13 and then extinction is caused by the interference.

$$\begin{aligned}\Delta L_{opt} &= L_2(n_{eq1} - n_{eq2} - \Delta n_{eq}) \\ &= \frac{\lambda}{2}\left(m + \frac{1}{2}\right)\end{aligned} \tag{9}$$

(m: integer number)

It is to be noted that, since the configuration of the other part and the fabrication method are same as those in the first embodiment and the modification to the first embodiment described above, description of them is omitted here.

Accordingly, with the optical semiconductor device according to the present embodiment, there is an advantage that the wavelength monitoring integrated optical semiconductor device (wavelength monitoring mechanism integrated semiconductor laser) of a small size and low power consumption wherein the devices for monitoring the oscillation wavelength of the semiconductor laser 11 are monolithically integrated on the same substrate can be easily produced at a low cost and the influence of the reflection returning light on the semiconductor laser 11 can be reduced.

Particularly, in the optical semiconductor device according to the present embodiment, since the phase shifter 81 is provided on the second optical waveguide 12C and a loss difference caused by phase adjustment (shift) is involved, a difference appears between the amplitudes of the reflection returning lights from both of the optical waveguides and full extinction cannot be achieved. However, production of the waveguide length with high accuracy is not required and the optical path length can be comparatively easily controlled after the device production. Therefore, there is an advantage that a high production yield can be implemented.

It is to be noted that, while the phase shifter 81 is provided on the second optical waveguide 12C in the embodiment described above, the provision of the phase shifter 81 is not limited to this, and, for example, the phase shifter 81 may be provided only on the other second optical waveguide 12B or the phase shifter 81 may be provided on both of the second optical waveguides 12B and 12C.

Further, while the waveguide lengths (physical lengths) of the second optical waveguides 12B and 12C are set equal to each other for simplification of the description of the embodiment described above, they need not be set equal to each other. For example, the configuration in the present embodiment and the configuration in the first embodiment described above may be combined with each other to adjust (shift) the phases of the reflection returning lights. In particular, in order to adjust the phases of the reflection returning lights, the waveguide lengths are set so that the optical path length difference satisfies the expression (1) given above and the waveguide lengths of the second optical waveguides 12B and 12C are different from each other, and the phases are adjusted (shifted) so that the optical path length satisfies the expression (9) given above (that is, the equivalent refractive index of the second optical waveguide 12C of the phase shifter 81 region is adjusted).

It is to be noted that, while the present embodiment is described as a modification to the first embodiment described above, the present invention is not limited to this, and, for example, the configuration according to the present embodiment can be applied also to the second to sixth embodiments described above.

Others

The present invention is not limited to the embodiments specifically described above, and variations and modifications can be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. An optical semiconductor device, comprising:
a semiconductor laser;
a first optical waveguide connected to the semiconductor laser;
an optical coupler adapted to branch light guided from the semiconductor laser through the first optical waveguide into two lights;
two second optical waveguides connected to the optical coupler;
a diffraction grating provided in each of the two second optical waveguides; and
an optical detector adapted to detect light guided through one of the two diffraction gratings; and wherein
the semiconductor laser, the first optical waveguide, the optical coupler, the second optical waveguides, the diffraction gratings and the optical detector are integrated on the same substrate; and
the optical semiconductor device is adapted such that phases of reflection returning light from the diffraction gratings side are displaced by .pi. from each other at a location of the optical coupler so that the reflection returning lights from the diffraction gratings side to the semiconductor laser side interfere with each other and thereby extinguish each other at the optical coupler.

2. The optical semiconductor device as claimed in claim 1, wherein the optical detector is provided at a position at which intensity of transmission light transmitted through the diffraction grating can be detected.

3. The optical semiconductor device as claimed in claim 2, further comprising:
a reflection light optical coupler interposed in each of the two second optical waveguides and adapted to branch at least part of reflection light reflected by the diffraction grating; and
a reflection light optical detector connected to each of the reflection light optical couplers and adapted to detect at least the reflection light reflected by each of the diffraction gratings.

4. The optical semiconductor device as claimed in claim 1, wherein the optical detector is provided at a position at which intensity of reflection light reflected by the diffraction grating can be detected.

5. The optical semiconductor device as claimed in claim 1, wherein optical path lengths of the reflection returning lights from the diffraction gratings side are different from each other.

6. The optical semiconductor device as claimed in claim 5, wherein waveguide lengths of the second optical waveguides are different from each other.

7. The optical semiconductor device as claimed in claim 5, wherein equivalent refractive indices of the second optical waveguides are different from each other.

8. The optical semiconductor device as claimed in claim 7, wherein one of the two second optical waveguides has a portion of a different width.

9. The optical semiconductor device as claimed in claim 5, further comprising a phase shifter provided on one or both of the two second optical waveguides.

10. The optical semiconductor device as claimed in claim 1, wherein optical characteristics of the diffraction gratings are same as each other.

11. The optical semiconductor device as claimed in claim 1, further comprising a dummy optical detector having a structure same as that of the optical detector and provided in a region to which light guided through the other one of the diffraction gratings is inputted.

12. The optical semiconductor device as claimed in claim 1, further comprising a light absorption region provided between the semiconductor laser and the optical coupler.

13. The optical semiconductor device as claimed in claim 1, further comprising:
an outputting optical coupler interposed in the first optical waveguide and adapted to branch part of output light outputted from the semiconductor laser; and
an outputting optical waveguide connected to the outputting optical coupler and adapted to output the output light outputted from the semiconductor laser to the outside.

14. The optical semiconductor device as claimed in claim 13, further comprising:
an output light detecting optical coupler interposed in the outputting optical waveguide and adapted to branch part of the output light outputted from the semiconductor laser; and
an output light optical detector connected to the output light detecting optical coupler and adapted to detect the output light outputted from the semiconductor laser.

15. The optical semiconductor device as claimed in claim 1, wherein the semiconductor laser is a tunable laser.

* * * * *